United States Patent
Zhou et al.

(10) Patent No.: US 10,438,932 B2
(45) Date of Patent: *Oct. 8, 2019

(54) SEMICONDUCTOR DEVICE AND METHOD OF INTEGRATING POWER MODULE WITH INTERPOSER AND OPPOSING SUBSTRATES

(71) Applicant: SEMICONDUCTOR COMPONENTS INDUSTRIES, LLC, Phoenix, AZ (US)

(72) Inventors: Jinchang Zhou, Scottsdale, AZ (US); Yusheng Lin, Phoenix, AZ (US); Mingjiao Liu, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 15/954,326

(22) Filed: Apr. 16, 2018

(65) Prior Publication Data

US 2018/0233491 A1 Aug. 16, 2018

Related U.S. Application Data

(63) Continuation of application No. 15/231,277, filed on Aug. 8, 2016, now Pat. No. 9,972,607.

(51) Int. Cl.
*H01L 25/07* (2006.01)
*H01L 29/739* (2006.01)
(Continued)

(52) U.S. Cl.
CPC ........ *H01L 25/071* (2013.01); *H01L 23/5384* (2013.01); *H01L 23/5389* (2013.01);
(Continued)

(58) Field of Classification Search
CPC ... H01L 25/071; H01L 23/5384; H01L 24/09; H01L 25/50; H01L 23/5385;
(Continued)

(56) References Cited

U.S. PATENT DOCUMENTS 7,554,188 B2 6/2009 Hauenstein
8,358,000 B2 1/2013 Beaupre et al.
(Continued)

FOREIGN PATENT DOCUMENTS

CN 203760452 U 8/2014
JP 2006066664 A 3/2006
JP 4385324 B2 12/2009

*Primary Examiner* — Feifei Yeung Lopez
(74) *Attorney, Agent, or Firm* — Adam R. Stephenson, Ltd.

(57) ABSTRACT

A semiconductor device has an interposer including a plurality of conductive vias formed through the interposer. A first semiconductor die is disposed over the interposer. A second semiconductor die is disposed over a first substrate. The first semiconductor die and second semiconductor die are power semiconductor devices. The interposer is disposed over the second semiconductor die opposite the first substrate. A second substrate is disposed over the first semiconductor die opposite the interposer. The first substrate and second substrate provide heat dissipation from the first semiconductor die and second semiconductor die from opposite sides of the semiconductor device. A plurality of first and second interconnect pads is formed in a pattern over the first semiconductor die and second semiconductor die. The second interconnect pads have a different area than the first interconnect pads to aid with alignment when stacking the assembly.

20 Claims, 9 Drawing Sheets

(51) Int. Cl.
  *H01L 25/00* (2006.01)
  *H01L 23/538* (2006.01)
  *H01L 25/11* (2006.01)
  *H01L 25/065* (2006.01)
  *H01L 41/083* (2006.01)
  *H01L 23/00* (2006.01)

(52) U.S. Cl.
  CPC .......... *H01L 24/09* (2013.01); *H01L 25/0652* (2013.01); *H01L 25/0655* (2013.01); *H01L 25/0657* (2013.01); *H01L 25/072* (2013.01); *H01L 25/074* (2013.01); *H01L 25/117* (2013.01); *H01L 25/50* (2013.01); *H01L 29/7395* (2013.01); *H01L 41/083* (2013.01); *H01L 23/5385* (2013.01); *H01L 2224/0401* (2013.01); *H01L 2224/05085* (2013.01); *H01L 2224/0603* (2013.01); *H01L 2224/06181* (2013.01); *H01L 2224/1403* (2013.01); *H01L 2224/29139* (2013.01); *H01L 2224/32225* (2013.01); *H01L 2224/73204* (2013.01); *H01L 2224/73253* (2013.01); *H01L 2224/81815* (2013.01); *H01L 2224/8384* (2013.01); *H01L 2224/83815* (2013.01); *H01L 2224/92242* (2013.01); *H01L 2225/06503* (2013.01); *H01L 2225/06517* (2013.01); *H01L 2225/06527* (2013.01); *H01L 2225/06572* (2013.01); *H01L 2924/13055* (2013.01); *H01L 2924/13091* (2013.01); *H01L 2924/19105* (2013.01)

(58) Field of Classification Search
  CPC . H01L 23/5389; H01L 25/117; H01L 25/074; H01L 25/0657; H01L 41/083; H01L 2225/06503; H01L 2225/06527; H01L 2224/05085; H01L 2925/0655
  See application file for complete search history.

(56) References Cited

U.S. PATENT DOCUMENTS

| | | | |
|---|---|---|---|
| 9,972,607 B2* | 5/2018 | Zhou | H01L 25/071 |
| 2002/0171405 A1 | 11/2002 | Watanabe | |
| 2003/0218243 A1 | 11/2003 | Chen | |
| 2007/0267739 A1* | 11/2007 | Kajiwara | H01L 23/16 |
| | | | 257/707 |
| 2013/0069239 A1* | 3/2013 | Kim | H01L 23/49827 |
| | | | 257/774 |

* cited by examiner

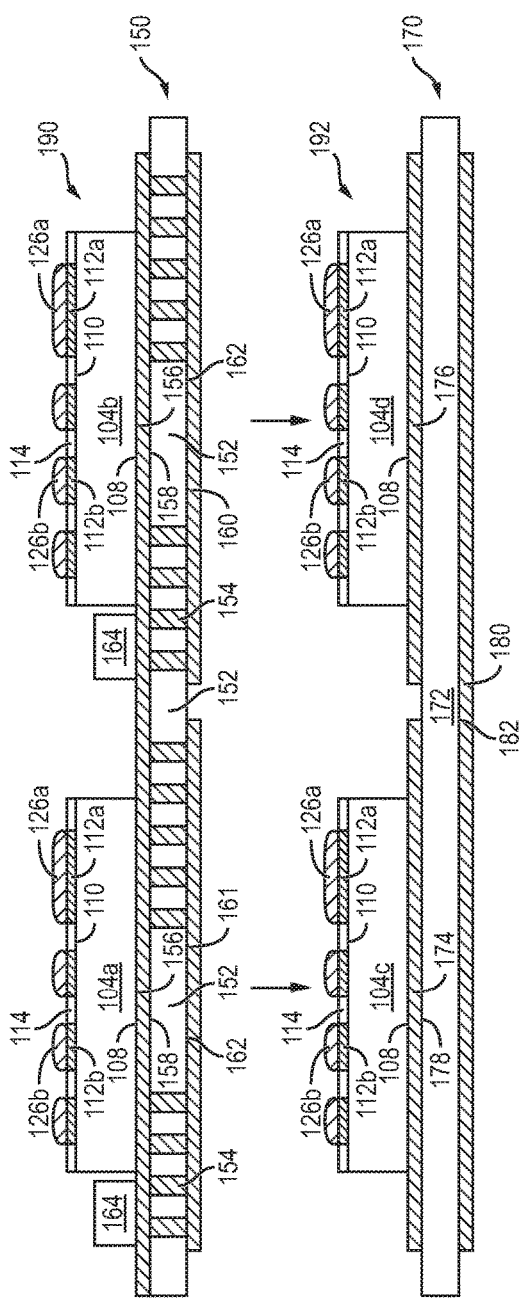
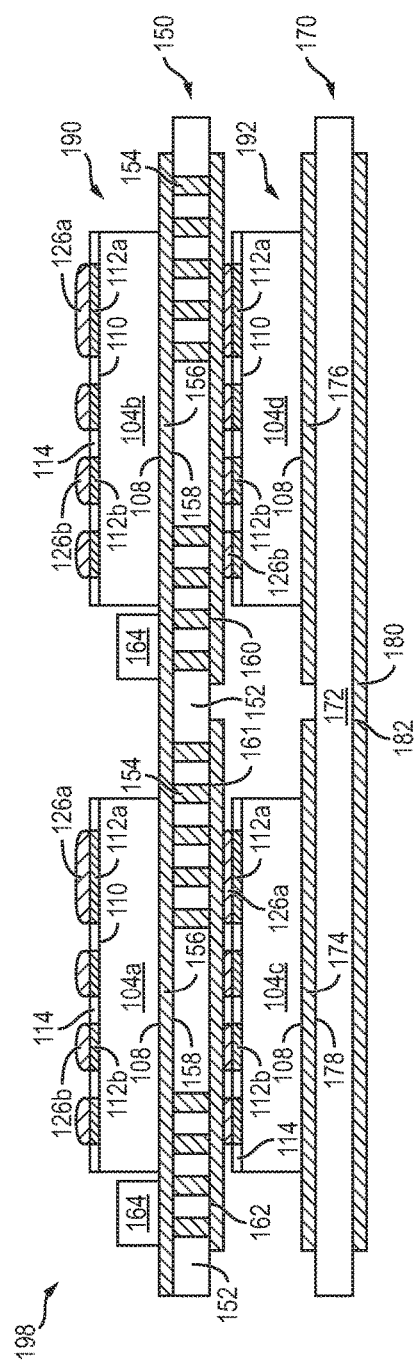
FIG. 4c
FIG. 4d

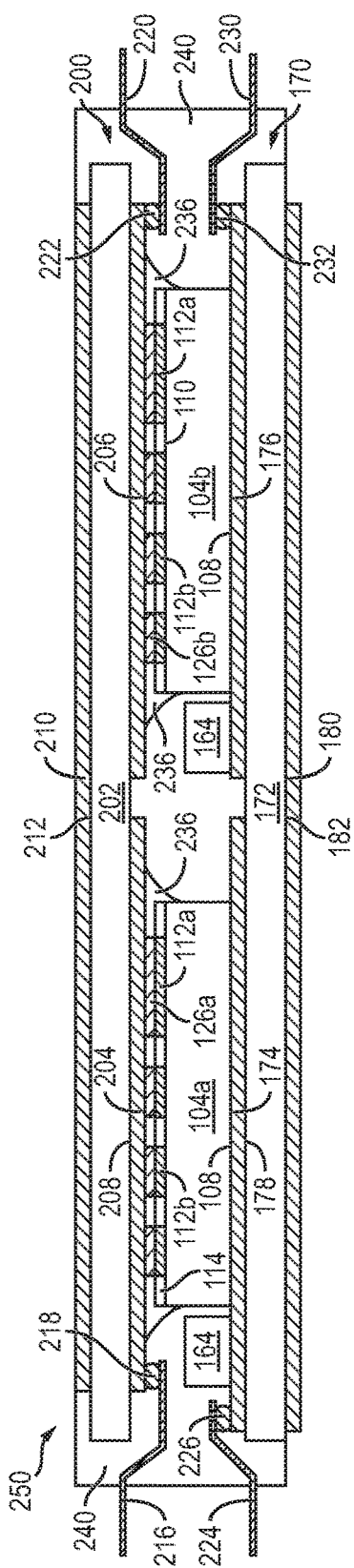
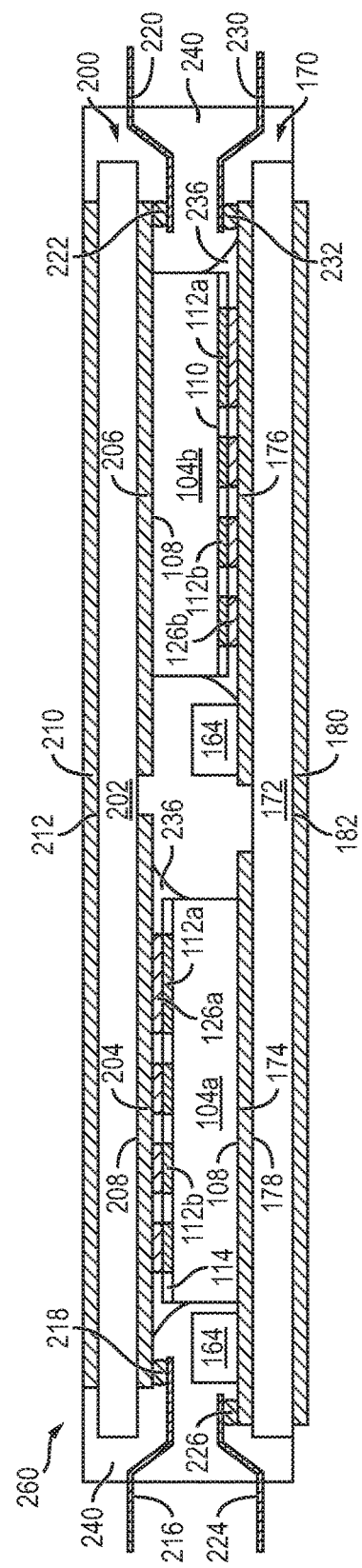
FIG. 5
FIG. 6

SEMICONDUCTOR DEVICE AND METHOD OF INTEGRATING POWER MODULE WITH INTERPOSER AND OPPOSING SUBSTRATES

CLAIM OF DOMESTIC PRIORITY

The present application is a continuation of U.S. patent application Ser. No. 15/231,277, filed Aug. 8, 2016, which application is incorporated herein by reference.

FIELD OF THE INVENTION

The present invention relates in general to semiconductor devices and, more particularly, to a semiconductor device and method of integrating a power module with an internal interposer and opposing substrates.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

FIG. 1a shows a conventional semiconductor die 10 with base substrate material 12, active surface 14, and active surface 16. An insulating layer 18 and interconnect pads 20 are formed over active surface 14.

Semiconductor die 10 may include a discrete power semiconductor device, such as a vertical insulated gate bipolar transistor (IGBT), diode, power MOSFET, or other power device. FIG. 1b shows a top view of active surface 14 with an IGBT, which combines the gate-drive feature of a metal oxide semiconductor field effect transistor (MOSFET) with the high-current and low-saturation-voltage of a bipolar transistor. The IGBT includes emitter regions 30a-30d, gate region 38, and sensor regions 40, 44, and 46, e.g., for current and temperature sensing. Active surface 16 operates as the collector of the IGBT. The IGBT is susceptible to high overshoot voltage during switching due to parasitic inductance. In addition, heat dissipation from semiconductor die 10 through base substrate material 12 is generally poor, which reduces efficiency, increases operating temperature, and lower reliability.

BRIEF DESCRIPTION OF THE DRAWINGS

FIG. 4a-4g illustrate a process of integrating a power module with an interposer and opposing substrates;

FIG. 5 illustrates an embodiment of the integrated power module with opposing substrates; and FIG. 6 illustrates another embodiment of the integrated power module with opposing substrates.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
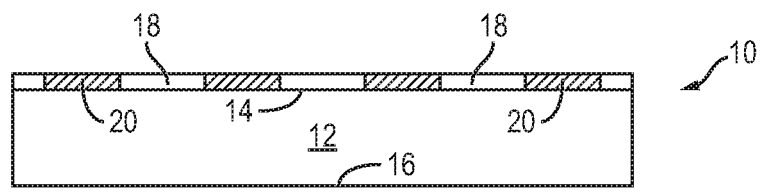
FIGS. 1a-1b illustrate a conventional discrete IGBT semiconductor device.
Figure 1B:
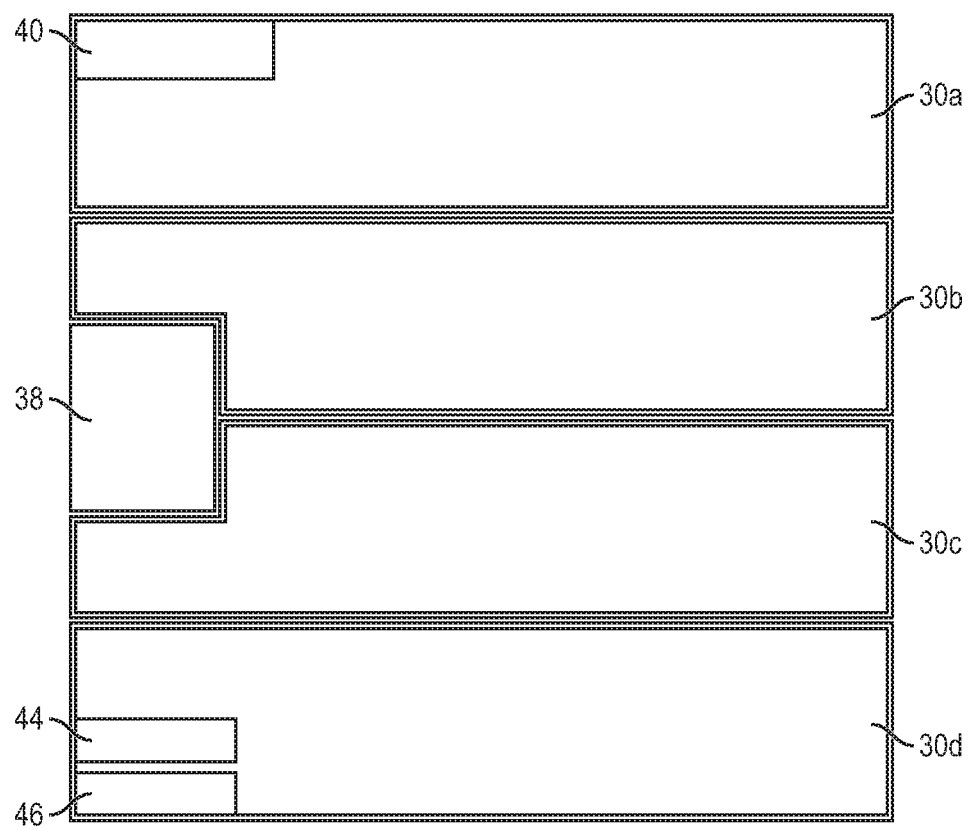
Figure 2A:
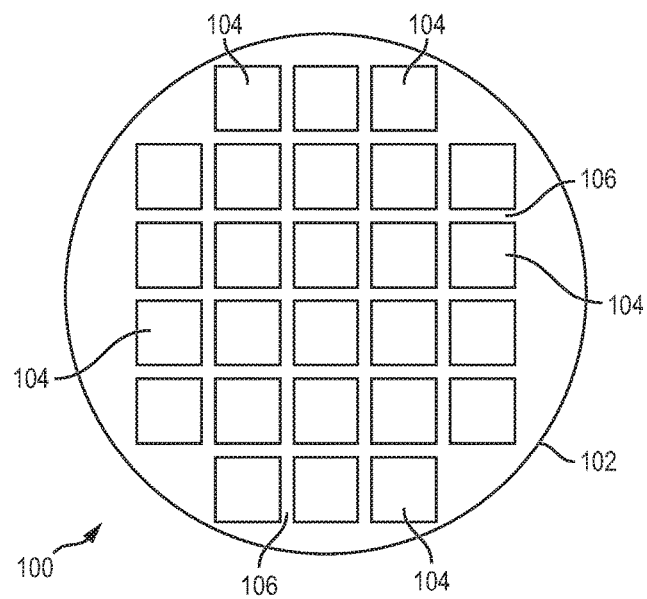
FIGS. 2a-2e illustrate a semiconductor wafer with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by a non-active, inter-die wafer area or saw street 106, as described above. Saw street 106 provides singulation areas to separate semiconductor wafer 100 into individual semiconductor die 104. In one embodiment, semiconductor wafer 100 has a width or diameter of 100-450 millimeters (mm).

Figure 2B:
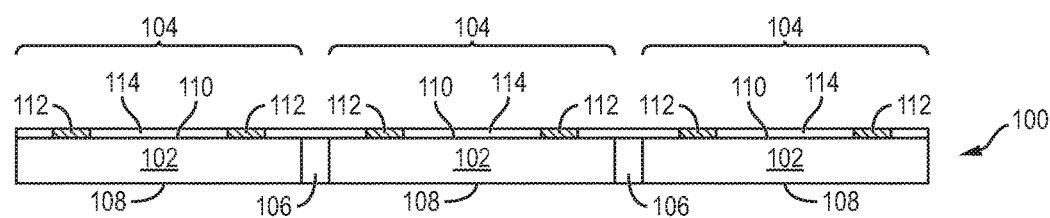

FIG. 2b shows a cross-sectional view of a portion of semiconductor wafer 100. Each semiconductor die 104 has back surface 108 and active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements to implement a discrete power semiconductor device, such as an IGBT, diode, power MOSFET, wide bandgap or narrow bandgap semiconductor device, and other power device.

An electrically conductive layer 112 is formed on active surface 110, or embedded with a passivation layer over the active surface, using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

An insulating or passivation layer 114 is formed over active surface 110 around conductive layer 112 using PVD, CVD, printing, lamination, spin coating or spray coating. Insulating layer 114 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBC)), polymer, or other material having similar insulating and structural properties.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

Figure 2C:
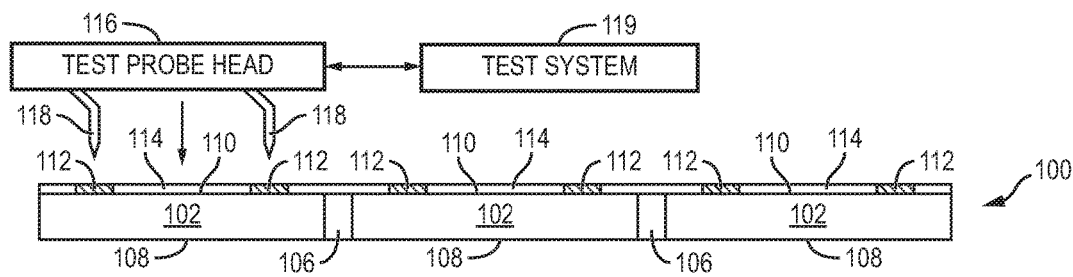

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to interconnect pads 112. Semiconductor die 104 responds to the electrical stimuli, which is measured by computer test system 120 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 2D:
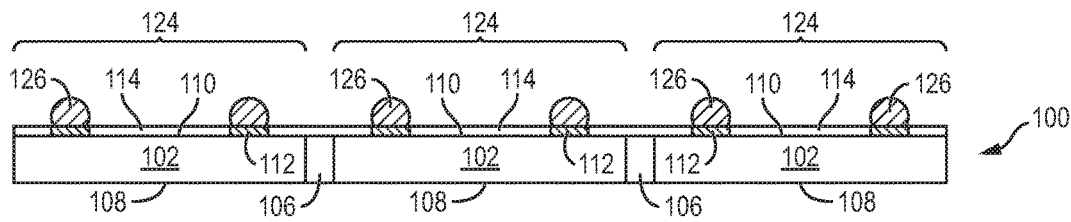

In FIG. 2d, an electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 126. In some applications, bumps 126 are reflowed a second time to improve electrical contact to conductive layer 112. In one embodiment, bumps 126 are formed over an under bump metallization (UBM) layer. Bumps 126 can also be compression bonded or thermos-compression bonded to conductive layer 112. Bumps 126 represent one type of interconnect structure that can be formed over conductive layer 112. The interconnect structure can also use conductive pillar, stud bump, micro bump, bond wires, conductive paste, or other electrical interconnect.

Figure 2E:
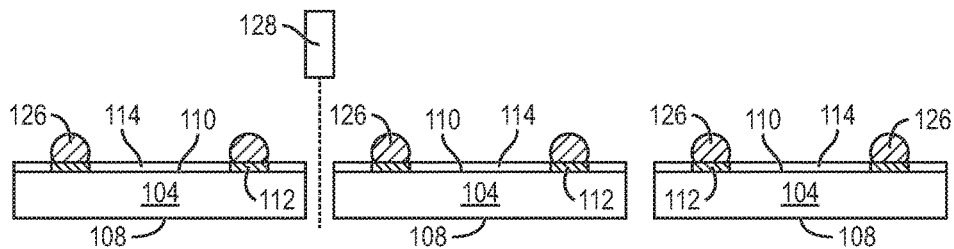

In FIG. 2e, semiconductor wafer 100 is singulated through saw streets 106 with saw blade or laser cutting tool 128 or plasma etching process into individual semiconductor die 104.

Figure 3A:
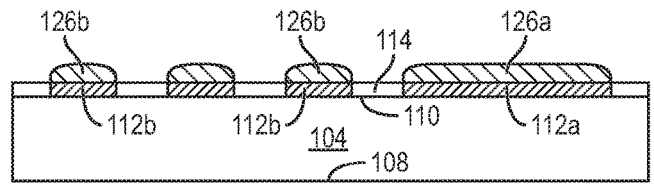
FIGS. 3a-3b illustrate a vertical IGBT with the interconnect pads arranged in a pattern of large pads and small pads.
Figure 3B:
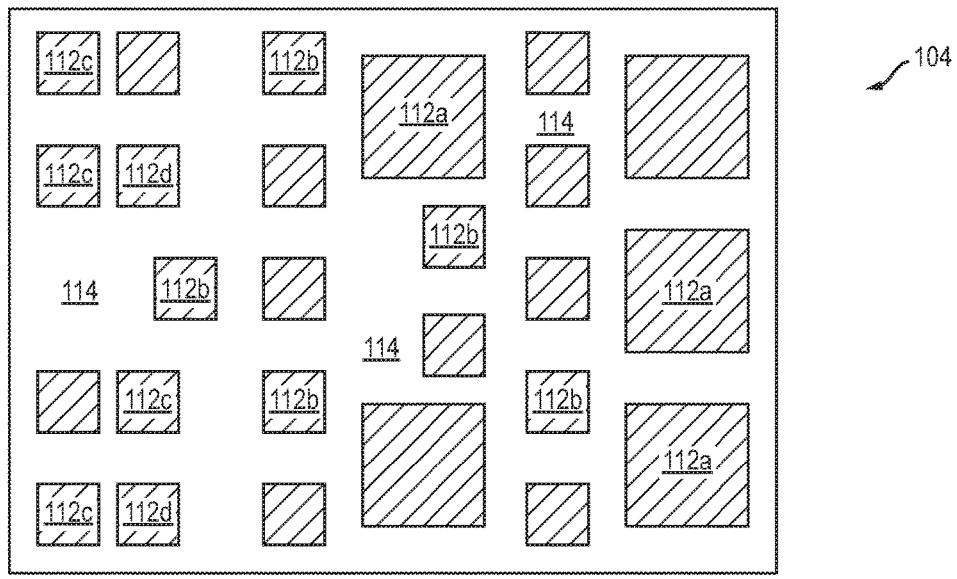

FIGS. 3a-3b illustrate semiconductor wafer 104 implemented as a vertical IGBT with the interconnect pads of conductive layer 112 arranged in an identifiable pattern of large pads and small pads. FIG. 3a is a cross-section view of semiconductor die 104 with bumps 126a-126b connected to the gate region, emitter regions, and sensing regions of the IGBT. Back surface 108 is the collector of the IGBT.

FIG. 3b is a top view of active surface 110 including insulating layer 114 and interconnect pads 112a and 112b coupled in common to emitter regions of the IGBT. In particular, interconnect pads 112a are large pads, e.g., 2.0 mm×2.0 mm, and interconnect pads 112b are small pads, e.g., 0.5 mm×0.5 mm. The different areas of interconnect pads 112a-112b provide high current carrying capacity, while reducing electro-migration and parasitic voltage overshoot. Interconnect pads 112c are coupled to one or more sensing regions of the IBGT, and interconnect pads 112d are coupled to the gate region of the IGBT. Interconnect pads 112c-112d are small pads, e.g., 0.5 mm×0.5 mm.

Interconnect pads 112a-112d are arranged in an identifiable pattern, as shown in FIG. 3b, to provide accurate and reliable alignment to the next level of integration, based on specific size and placement of large and small interconnect pads. For example, interconnect pads 112a can be arranged in an identifiable pattern of multiple parallel rows, or rows of alternating offset interconnect pads. Interconnect pads 112b can be arranged in an identifiable pattern of multiple parallel rows, or interspersed between interconnect pads 112a. Interconnect pads 112c-112d can be arranged in an identifiable pattern of groups of multiple parallel or offset rows. Bumps 126a over interconnect pads 112a are larger than bumps 126b over interconnect pads 112b-112d.

Figure 4A:
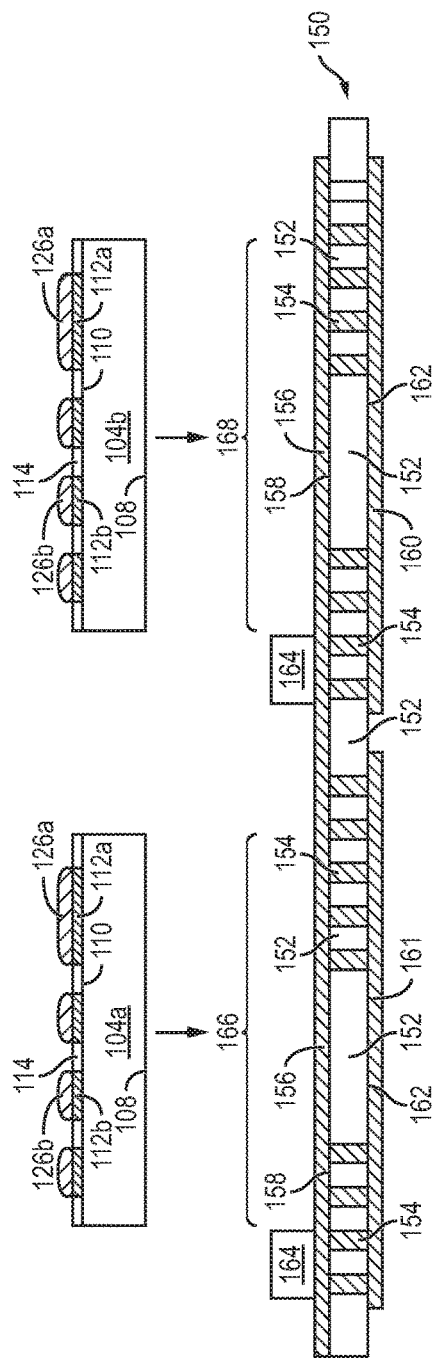

FIGS. 4a-4g illustrate a process of forming a power integrated module (PIM) and/or intelligent power module (IPM) with an interior interposer with vertical electrical interconnect and opposing substrates. In FIG. 4a, interposer 150 includes core substrate 152 made of an insulating material, such as ceramic, glass, or polymer, with conductive vias 154 formed through the core substrate for vertical electrical interconnect. Core substrate 152 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. A conductive layer 156 is formed over surface 158 of core substrate 152, and conductive layers 160 and 161 are formed over surface 162 of core substrate 152. Conductive layers 156 and 160-161 are formed using PVD, CVD, electrolytic plating, electroless plating process, evaporation, or other suitable metal deposition process or metal layer joining with substrate 170 through sintering process. Conductive layers 156 and 160-161 includes one or more layers of aluminum Al, Cu, Sn, Ni, Au, Ag, Ti, TiW, or other suitable conductive material. Conductive layers 156 and 160-161 are patterned into portions that are electrically common or electrically isolated depending on the design and function of semiconductor die 104a-104d.

A control circuit 164 is disposed over conductive layer 156. Alternatively, a discrete semiconductor device 164 is disposed over conductive layer 156. The different portions of conductive layer 156 are coupled to external terminals of a leadframe, control circuit or discrete device 164, and back surfaces 108 of semiconductor die 104a-104b.

Semiconductor die 104a from FIGS. 3a-3b is positioned over and aligned with die attach area 166 of interposer 150. Semiconductor die 104b from FIGS. 3a-3b is positioned over and aligned with die attach area 168 of interposer 150. Semiconductor die 104a-104b can each be a same type or different type of discrete semiconductor device, such as an IGBT, diode, power MOSFET, wide bandgap or narrow bandgap semiconductor device, and other power device. In the case of an IGBT, back surface 108 of semiconductor die 104a is the collector and makes electrical connection to conductive layer 156 within die attach area 166, and back surface 108 of semiconductor die 104b makes electrical connection to conductive layer 156 within die attach area 168. Interconnect pads 112a-112d of semiconductor die 104a-104b can be coupled to the emitter region, gate region, and sensing regions of the IGBT.

Figure 4B:
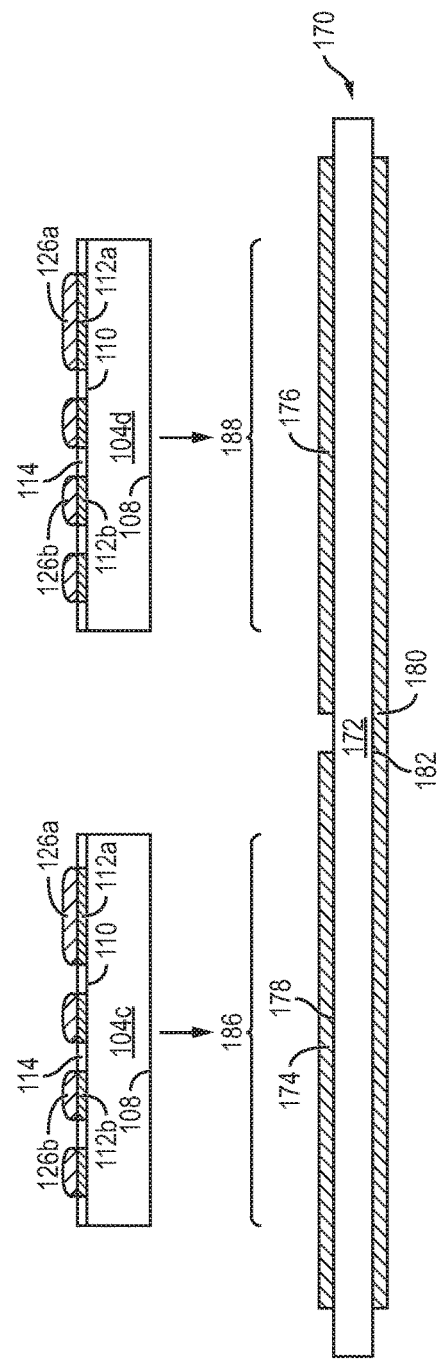

In FIG. 4b, substrate 170 includes core 172 made of an electrically insulating material, such as ceramic, glass, or polymer. Core 172 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Core 172 is made with thermally conductive material to provide substrate 170 for effective heat dissipation. Conductive layers 174 and 176 are formed over surface 178 of core material 172, and conductive layer 180 is formed over surface 182 of core material 172. Conductive layers 174-176 and 180 are formed using PVD, CVD, electrolytic plating, electroless plating process, evaporation, or other suitable metal deposition process or metal layer joining with substrate 170 through sintering process. Conductive layers 174-176 and 180 includes one or more layers of aluminum Al, Cu, Sn, Ni, Au, Ag, Ti, TiW, or other suitable conductive material. Conductive layers 174-176 are patterned into portions that are electrically common or electrically isolated depending on the design and function of semiconductor die 104a-104d. The different portions of conductive layer 174-176 are coupled to bumps 126a-126b over interconnect pads 112a-112d of semiconductor die 104c-104d and external terminals of a leadframe.

Semiconductor die 104c from FIGS. 3a-3b is positioned over and aligned with die attach area 186 of substrate 170. Semiconductor die 104d from FIGS. 3a-3b is positioned over and aligned with die attach area 188 of substrate 170. Semiconductor die 104c-104d can each be a same type or different type of discrete semiconductor device, such as an IGBT, diode, power MOSFET, wide bandgap or narrow bandgap semiconductor device, and other power device. In the case of an IGBT, back surface 108 of semiconductor die 104c is the collector and makes electrical connection to conductive layer 174 within die attach area 186, and back surface 108 of semiconductor die 104d makes electrical connection to conductive layer 176 within die attach area 168. Interconnect pads 112a-112d of semiconductor die 104c-104d can be coupled to the emitter region, gate region, and sensing regions of the IGBT.

FIG. 4c shows semiconductor die 104a-104b mounted to interposer 150 as assembled interposer 190, and semiconductor die 104c-104d mounted to substrate 170 as assembled substrate 192. Back surfaces 108 of semiconductor die 104a-104b are bonded to conductive layer 156 in die attach area 166 and conductive layer 156 in die attach area 168, respectively, by reflow of conductive material, Ag sintering, conductive paste, or other electrical interconnect. Back surfaces 108 of semiconductor die 104c-104d are bonded to conductive layers 174 and 176, respectively, by reflow of conductive material, Ag sintering, conductive paste, or other electrical interconnect. Assembly interposer 190 is positioned over and aligned with assembled substrate 192.

FIG. 4d shows assembled thermal interposer 190 mounted to assembled substrate 192 as 3D stacked assembled substrates 198. The large and small interconnect pads 112a-112d of FIGS. 3a-3b provide accurate and reliable alignment and mounting of interposer 150 to semiconductor die 104c-104d. Bumps 126a-126b of semiconductor die 104c-104d are bonded to conductive layers 160-161 of interposer 150 by a reflow process. The temperature and timing of the reflow process, as well as the bonding material, is selected to prevent debonding back surfaces 108 of semiconductor die 104a-104d from conductive layer 156, 174, and 176.

Figure 4E:
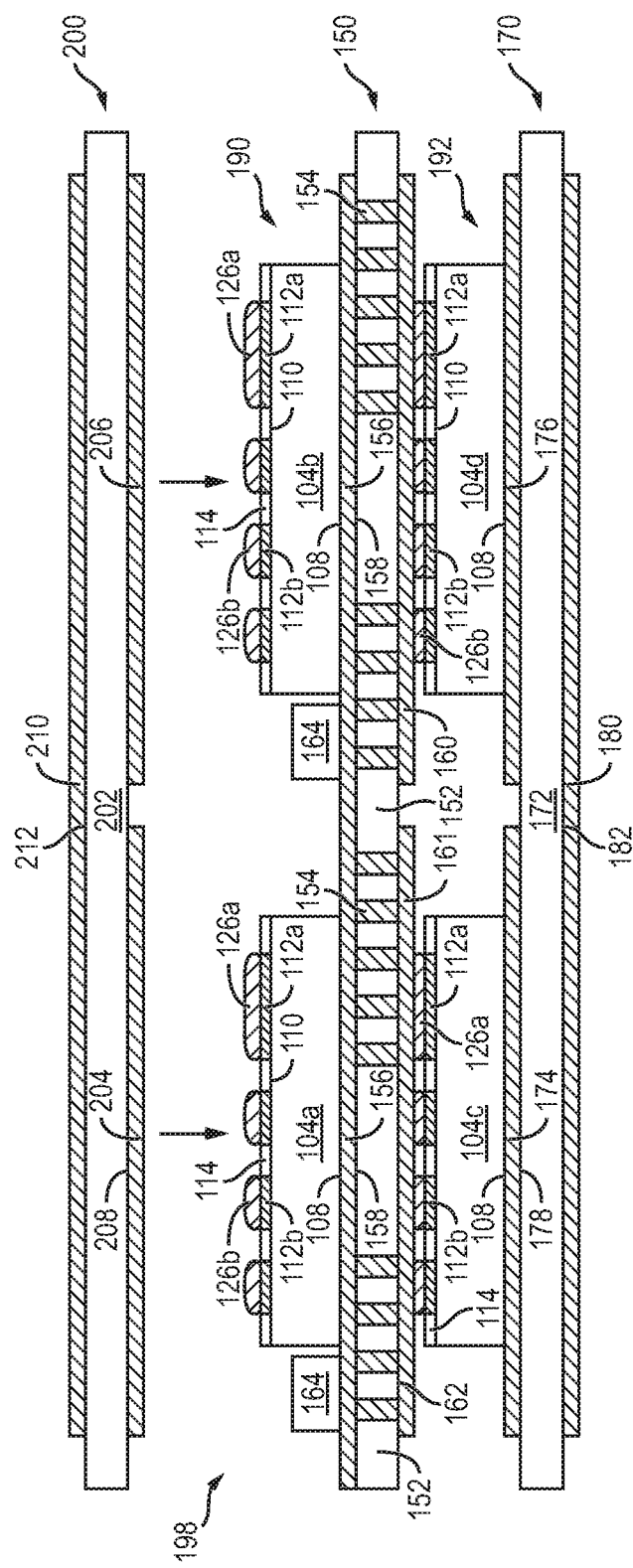

In FIG. 4e, substrate 200 includes core 202 made of an electrically insulating material, such as ceramic, glass, or polymer. Core material 202 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Core material 202 is made with thermally conductive material to provide substrate 200 for effective heat dissipation. Conductive layers 204 and 206 are formed over surface 208 of core material 202, and conductive layer 210 is formed over surface 212 of core material 202. Conductive layers 204-206 and 210 are formed using PVD, CVD, electrolytic plating, electroless plating process, evaporation, or other suitable metal deposition process or metal layer joining with substrate 170 through sintering process. Conductive layers 204-206 and 210 includes one or more layers of aluminum Al, Cu, Sn, Ni, Au, Ag, Ti, TiW, or other suitable conductive material. Conductive layers 204-206 are patterned into portions that are electrically common or electrically isolated depending on the design and function of semiconductor die 104a-104d. The different portions of conductive layer 204-206 are coupled to bumps 126a-126b over interconnect pads 112a-112d of semiconductor die 104a-104b and external terminals of a leadframe. Substrate 200 is positioned over and aligned with 3D stacked assembled substrates 198.

Figure 4F:
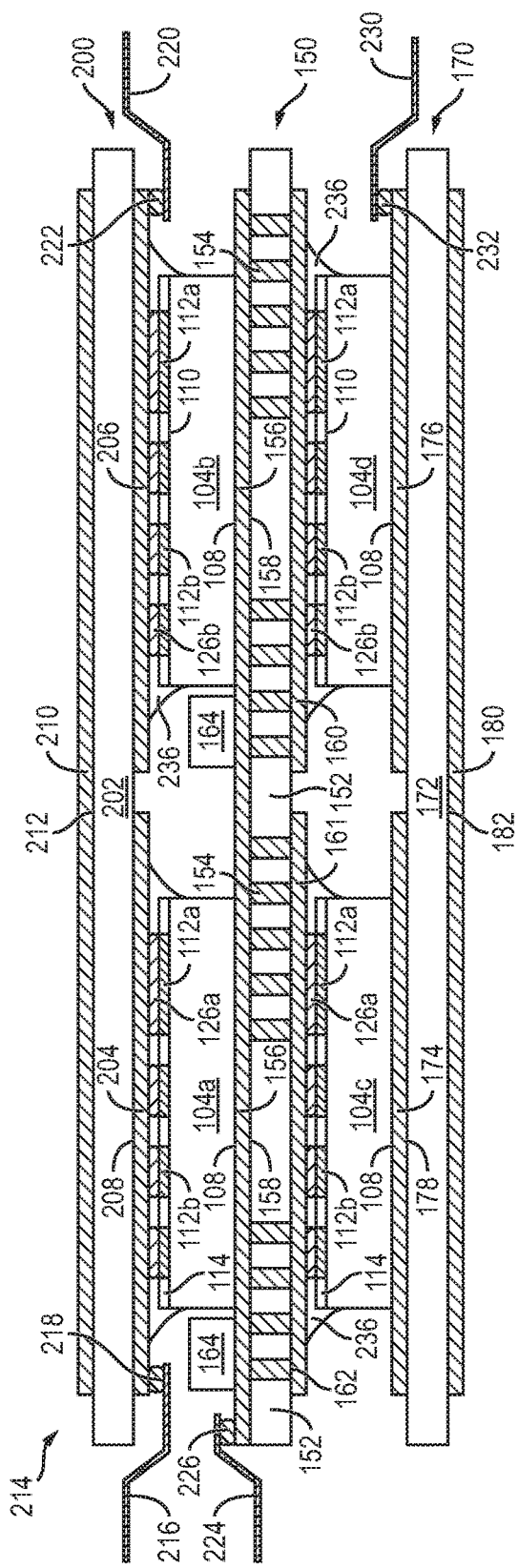

FIG. 4f shows substrate 200 mounted to semiconductor die 104a-104b to make 3D stacked assembled substrates 214. The large and small interconnect pads 112a-112d of FIGS. 3a-3b provide accurate and reliable alignment and mounting of interposer 200 to semiconductor die 104a-104b. Bumps 126a-126b of semiconductor die 104a-104b are bonded to conductive layers 204-206 of interposer 200 by a reflow process. The temperature and timing of the reflow process, as well as the bonding material, is selected to prevent debonding back surfaces 108 of semiconductor die 104a-104d from conductive layer 156, 174, and 176, or bumps 126a-126b of semiconductor die 104c-104d from conductive layers 160-161 of interposer 150. Semiconductor die 104a-104d are electrically connected through conductive layers 156 and 160-161 and conductive vias 154 of interposer 150, and conductive layers 174-176 of substrate 170, and conductive layers 204-206 of substrate 200. The electrical interconnect of semiconductor die 104a-104d through 3D stacked assembled substrates 214 reduces signal path length and electrical parasitic effects.

Heat generated from the operation of semiconductor die 104a-104b is dissipated through conductive layers 204-206, core material 202, and conductive layer 210. Heat generated from the operation of semiconductor die 104c-104d is dissipated through conductive layers 174-176, core material 172, and conductive layer 180. Accordingly, 3D stacked assembled substrates 214 has an internal interposer 150 for electrical interconnect between semiconductor die 104a-104d, and substrates 170 and 200 to dissipate heat generated by semiconductor die 104a-104d from the opposing surfaces of the 3D stacked assembled substrates.

For external electrical interconnect to 3D stacked assembled substrates 214, lead 216 is coupled to conductive layer 204 with bump 218, and lead 220 is coupled to conductive layer 206 with bump 222. Lead 224 is coupled to conductive layer 156 with bump 226, and lead 230 is coupled to conductive layer 176 with bump 232. Leads 216, 220, 224, and 230 are external terminals of a leadframe. Alternatively, leads 216, 220, 224, and 230 attached to the conductive layers using Ag sintering, metal spray, ultrasonic, or cold weld bonding. When leads 216, 220, 224 and 230 are attached by silver sintering, welding, etc., the attachment can be made before semiconductor die 104a-104d are attached to interposer 150 and substrates 170 and 20, or simultaneously.

An underfill material 236 is deposited between semiconductor die 104a-104b and substrate 200 around bumps 126a-126b, and underfill material 236 is further deposited between semiconductor die 104c-104d and substrate 170 around bumps 126a-126b.

Figure 4G:
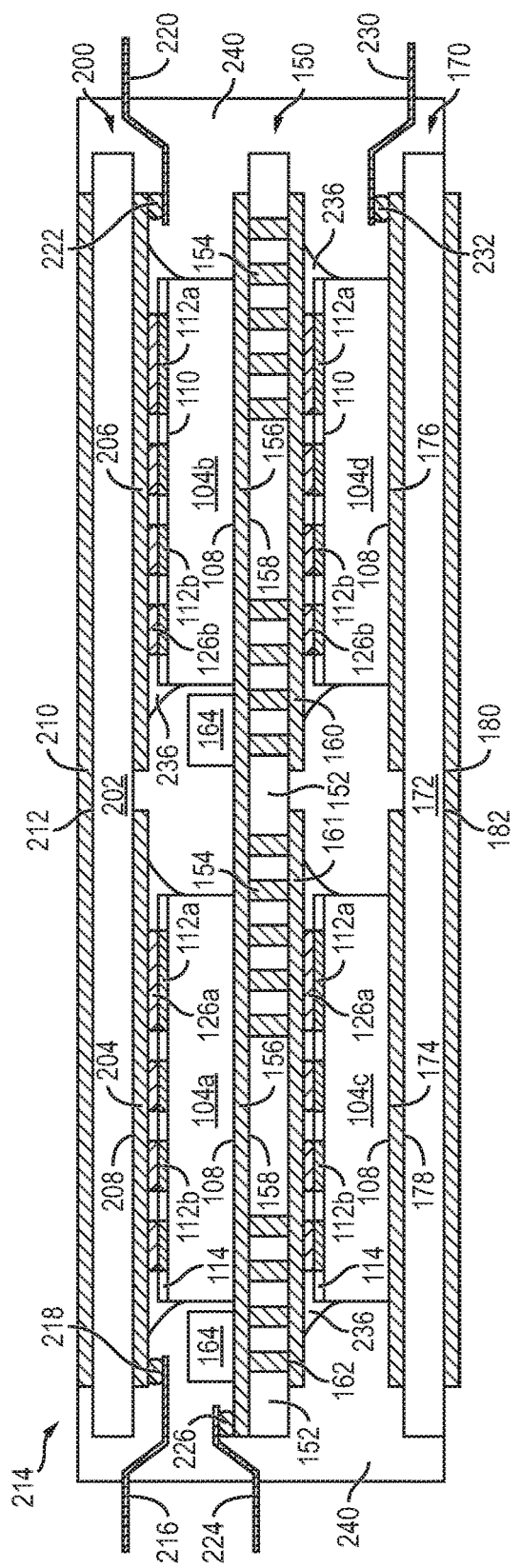

In FIG. 4g, an encapsulant or molding compound 240 is deposited over interposer 150, substrates 170 and 200, and around semiconductor die 104a-104b as an insulating material using a compressive molding, transfer molding, liquid encapsulant molding, vacuum lamination, spin coating, or other suitable applicator. In particular, encapsulant 240 covers the side surfaces and surface 242 of semiconductor die 104. Encapsulant 240 can be high purity polymer composite material, such as epoxy resin with filler, epoxy acrylate with filler, or polymer with proper filler. Encapsulant 240 is non-conductive and environmentally protects the semiconductor device from external elements and contaminants. Encapsulant 240 also protects semiconductor die 104 from degradation due to exposure to light.

The 3D stacked assembled substrates 214 is referred to as IPM 214 with a control circuit 164 providing control of the IPM. The 3D stacked assembled substrates 214 is referred to as PIM 214 with a discrete semiconductor device 164. PIM/IPM 214 provides close arrangement of semiconductor die 104a-104d with electrical connection through conductive layers 156 and 160-161 and conductive vias 154 of interposer 150, and conductive layers 174-176 of substrate 170, and conductive layers 204-206 of substrate 200. The electrical interconnect of semiconductor die 104a-104d through PIM/IPM 214 reduces signal path length and electrical parasitic effects. In addition, PIM/IPM 214 exhibits effective heat dissipation from semiconductor die 104a-104d through thermally conductive cores 172 and 202 and conductive layers 180 and 210 of substrates 170 and 200. The substrates 170 and 200 provide heat dissipation from opposing surfaces of PIM/IPM 214. Substrates 170 and 200 electrically isolate internal semiconductor die 104a-104d. The large and small interconnect pads 112a-112d of FIGS. 3a-3b provide accurate and reliable alignment and mounting of semiconductor die 104c-104d to interposer 150 and semiconductor die 104a-104b to interposer 200. The efficient assembly of PIM/IPM 214 reduces package size, simplifies manufacturing, increases production, and reduces repair time.

FIG. 5 shows an embodiment of PIM/IPM 250 with semiconductor die 104a-104b disposed between substrates 170 and 200, i.e. without interposer 150 or semiconductor die 104c-104d. Components with a similar function are assigned the same reference numbers used in FIGS. 4a-4g. Back surfaces 108 of semiconductor die 104a-104b are mounted to conductive layers 174 and 176 of substrate 170. The thickness of conductive layers 174-176 and 180 of substrate 170 and conductive layers 204-206 and 210 of substrate 200 can be selected for optimal heat dissipation. For example, conductive layers 174-176 and 180 and conductive layers 204-206 and 210 can be made thicker for a thinner semiconductor die 104a-104b, respectively. Alternatively, conductive layers 174-176 and 180 and conductive layers 204-206 and 210 can be made thinner for a thicker semiconductor die 104a-104b, respectively.

FIG. 6 shows an embodiment of PIM/IPM 260 with semiconductor die 104a-104b disposed between substrates 170 and 200, i.e. without interposer 150 or semiconductor die 104c-104d. Components with a similar function are assigned the same reference numbers used in FIGS. 4a-4g. Back surface 108 of semiconductor die 104a is mounted to conductive layer 174 of substrate 170, and back surface 108 of semiconductor die 104b is mounted to conductive layer 206 of substrate 200. Bumps 126a-126b of semiconductor die 104b are connected to conductive layer 176 of substrate 170. The thickness of conductive layers 174-176 and 180 of substrate 170 and conductive layers 204-206 and 210 of substrate 200 can be selected to accommodate semiconductor die 104a-104b of different thickness. For example, conductive layers 174-176 and 180 and conductive layers 204-206 and 210 can be made thicker for a thinner semiconductor die 104a-104b, respectively, and still maintain the same package height. Alternatively, conductive layers 174-176 and 180 and conductive layers 204-206 and 210 can be made thinner for a thicker semiconductor die 104a-104b, respectively, and still maintain the same package height.

PIM/IPM 250 and 260 provide close arrangement of semiconductor die 104a-104b with electrical connection through conductive layers 174-176 of substrate 170, and conductive layers 204-206 of substrate 200. The electrical interconnect of semiconductor die 104a-104b through PIM/IPM 250 and 260 reduces signal path length and electrical parasitic effects. In addition, PIM/IPM 250 and 260 exhibits effective heat dissipation from semiconductor die 104a-104d through thermally conductive cores 172 and 202 and conductive layers 180 and 210 of substrates 170 and 200. The substrates 170 and 200 provide heat dissipation from opposing surfaces of PIM/IPM 250 and 260. Substrates 170 and 200 electrically isolate internal semiconductor die 104a-104d. The large and small interconnect pads 112a-112d of FIGS. 3a-3b provide accurate and reliable alignment and mounting of semiconductor die 104a-104b to interposers 170 and 200. The efficient assembly of PIM/IPM 250 and 260 reduces package size, simplifies manufacturing, increases production, and reduces repair time.

While one or more embodiments have been illustrated and described in detail, the skilled artisan will appreciate that modifications and adaptations to those embodiments may be made without departing from the scope of the present disclosure.

What is claimed:

1. A semiconductor device, comprising:
    a first substrate comprising a first conductive layer formed over a first surface of the first substrate and a second conductive layer formed over a second surface of the first substrate opposite the first surface of the first substrate, wherein no portion of the first conductive layer is electrically connected to the second conductive layer;
    a second substrate;
    an interposer comprising an electrically conductive vertical interconnect structure disposed between the first substrate and the second substrate; and
    a first semiconductor die disposed between the first substrate and the second substrate.

2. The semiconductor device of claim 1, wherein the second substrate comprises a third conductive layer formed over a first surface of the second substrate and a fourth conductive layer formed over a second surface of the second substrate opposite the first surface of the second substrate.

3. The semiconductor device of claim 1, wherein the first semiconductor die comprises a power semiconductor device.

4. The semiconductor device of claim 1, further comprising
    a second semiconductor die disposed between the interposer and the first substrate or the second substrate.

5. The semiconductor device of claim 1, further comprising an encapsulant deposited over the first substrate and the second substrate and around the first semiconductor die.

6. The semiconductor device of claim 1, wherein a thickness of the first conductive layer and a thickness of the second conductive layer are selected according to a thickness of the first semiconductor die.

7. A semiconductor device, comprising:
  a first substrate comprising a first conductive layer formed over a first surface of the first substrate and a second conductive layer formed over a second surface of the first substrate opposite the first surface of the first substrate, wherein the first conductive layer is electrically isolated from the second conductive layer;
  a first semiconductor die disposed over the first substrate;
  a second substrate disposed over the first semiconductor die opposite the first substrate; and
  an interposer comprising an electrically conductive vertical interconnect structure disposed between the first substrate and the second substrate.

8. The semiconductor device of claim 7, wherein the second substrate comprises a third conductive layer formed over a first surface of the second substrate and a fourth conductive layer formed over a second surface of the second substrate opposite the first surface of the second substrate.

9. The semiconductor device of claim 8, wherein the third conductive layer is electrically isolated from the fourth conductive layer.

10. The semiconductor device of claim 7, wherein the first semiconductor die comprises a power semiconductor device.

11. The semiconductor device of claim 7, further comprising
  a second semiconductor die disposed between the interposer and the first substrate or the second substrate.

12. The semiconductor device of claim 7, further comprising an encapsulant deposited over the first substrate and the second substrate and around the first semiconductor die.

13. The semiconductor device of claim 7, wherein a thickness of the first conductive layer and a thickness of the second conductive layer are selected according to a thickness of the first semiconductor die.

14. A method of making a semiconductor device, comprising:
  providing a first substrate comprising a first conductive layer formed over a first surface of the first substrate and a second conductive layer formed over a second surface of the first substrate opposite the first surface of the first substrate, wherein the first conductive layer is electrically isolated from the second conductive layer;
  disposing a first semiconductor die over the first substrate;
  disposing a second substrate over the first semiconductor die opposite the first substrate; and
  disposing an interposer comprising an electrically conductive vertical interconnect structure between the first substrate and second substrate.

15. The method of claim 14, wherein the second substrate comprises a third conductive layer formed over a first surface of the second substrate and a fourth conductive layer formed over a second surface of the second substrate opposite the first surface of the second substrate.

16. The method of claim 15, wherein the third conductive layer is electrically isolated from the fourth conductive layer.

17. The method of claim 14, wherein the first semiconductor die comprises a power semiconductor device.

18. The method of claim 14, further comprising
  disposing a second semiconductor die between the interposer and the first substrate or the second substrate.

19. The method of claim 14, further comprising an encapsulant deposited over the first substrate and the second substrate and around the first semiconductor die.

20. The method of claim 14, wherein a thickness of the first conductive layer and a thickness of the second conductive layer are selected according to a thickness of the first semiconductor die.

* * * * *